United States Patent [19]

Gay

[11] 4,451,792

[45] May 29, 1984

[54] AUTO-TUNED FREQUENCY DISCRIMINATOR

[75] Inventor: Michael J. Gay, Coppet, Switzerland

[73] Assignee: Motorola, Inc., Schaumburg, Ill.

[21] Appl. No.: 314,162

[22] Filed: Oct. 23, 1981

[51] Int. Cl.³ .................. H03D 1/02; H03D 1/18; H03D 1/20

[52] U.S. Cl. .................. 329/145; 329/103; 329/136; 329/168; 455/214

[58] Field of Search ............... 329/103, 136, 137, 145, 329/168; 455/214, 337

[56] References Cited

U.S. PATENT DOCUMENTS 4,054,840 10/1977 Sato ........................ 329/103
4,127,825 11/1978 Blomley .................. 329/103
4,388,595 6/1983 Brooks .................... 329/145

*Primary Examiner*—John S. Heyman
*Assistant Examiner*—N. Biase
*Attorney, Agent, or Firm*—Joe E. Barbee

[57] ABSTRACT

An integrable auto-tuned frequency discriminator is provided having a feedback circuit to tune the discriminator when an input signal having a reference frequency is applied at the input of the frequency discriminator. The input signal is multiplied by a delayed version thereof which is provided by a delay filter. The length of delay is varied by altering the transfer function of the delay filter in response to delay filter control inputs. The discriminator output is coupled to a feedback circuit which generates the control input signals, thereby tuning the delay filter to provide a discriminator output reference level. A control input to the feedback circuit provides the capability to tune the delay filter to a carrier frequency which is offset from the reference frequency. A gate input to the feedback circuit disables the feedback input after the frequency discriminator has been tuned.

12 Claims, 5 Drawing Figures

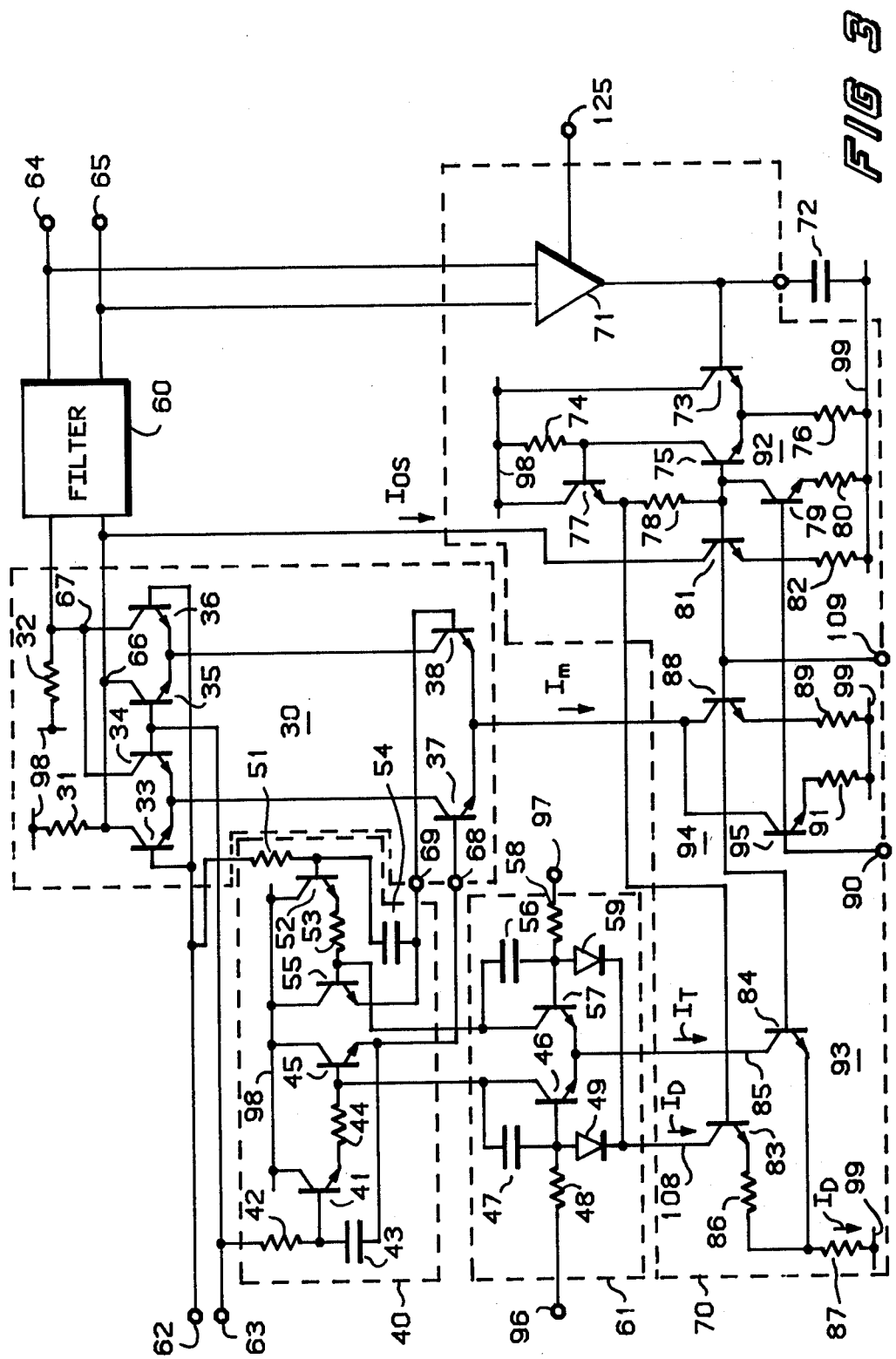

AUTO-TUNED FREQUENCY DISCRIMINATOR

BACKGROUND OF THE INVENTION

This invention relates, in general, to frequency discriminators, and more particularly, to an auto-tuned frequency discriminator suitable for being integrated in an integrated circuit.

In many electronic systems there is a need for providing an FM demodulator and it is desirable to implement such a demodulator as simply and economically as possible. One form of FM demodulator is a frequency discriminator which provides an output voltage proportional to the input frequency deviation from some known reference frequency.

An example where such a demodulator may be used is in the color processing section of a multistandard television system for receiving both PAL and SECAM transmissions. The SECAM system utilizes frequency modulation of a 4.406 MHz subcarrier and a 4.25 MHz subcarrier to encode chroma information. In contrast, the PAL system uses amplitude modulation of quadrature components of a 4.433 MHz subcarrier. Therefore the multistandard color decoder must include both PAL and SECAM decoder sections.

Prior art multistandard color processing systems include PAL and SECAM color decoders and the signal identification and switching circuitry required to automatically switch between the PAL and SECAM decoders. Such systems are implemented using multiple integrated circuits and require discrete components and external interfacing as a result.

In developing a more economic multistandard decoder it is desirable to implement both the PAL and SECAM decoders in a single integrated circuit using as few external components as possible. SECAM decoders in the prior art have utilized either frequency discriminators or phase-locked loop demodulators. The former approach has required using external tuned-circuit components. The latter has involved circuitry of a complexity that has prohibited the addition of other sections, such as a PAL decoder, on the same integrated circuit. Therefore, a frequency discriminator sufficiently simple for integration with a PAL decoder and having integrated tuned-circuit components provides a desirable option to SECAM color decoders.

Integration of the tuned-circuit components creates several problems not associated with discriminators having discrete tuned circuit components. Integrated components can have large component value variations from nominal value. The fully integrated frequency discriminator must include some method for tuning out these component variations. It is often desirable that this tuning procedure occur automatically. Many systems also require tuning the frequency discriminator to several different carrier frequencies.

Accordingly, it is an object of the present invention is to provide a frequency discriminator which can be automatically tuned to compensate for circuit component tolerances.

Another object of the present invention is to provide an improved frequency discriminator which can be tuned to multiple carrier frequencies.

Yet another object is to provide an auto-tuned frequency discriminator which is easily integrable on a single integrated circuit.

A further object is to provide an improved frequency discriminator which is suitable for use in a SECAM color decoder.

Yet a further object is to provide a frequency discriminator which is suitable for use in a SECAM color decoder and which is suitable for integration into a multistandard television color decoder in a single integrated circuit.

SUMMARY OF THE INVENTION

In carrying out the above and other objects of the invention there is provided, in one form, a frequency discriminator including a multiplier circuit having an input signal at a first multiplier input, a time-delayed version of the input signal at a second multiplier input, and an output proportional to the product of the inputs. A delay means for providing the time-delayed signal includes an input coupled to the discriminator input, an output coupled to the second input of the multiplier, and at least one control input. The time delay provided by the delay means is variable in response to the at least one control input. The multiplier output is coupled to the input of a filter to remove undesired high frequency components from the filter output signal. The output of the filter is coupled to the output of the frequency discriminator and to the input of a feedback means. The feedback means has at least one output coupled to the at least one control input of the delay means so that the variable time delay is responsive to the output of the filter.

BRIEF DESCRIPTION OF THE DRAWINGS

FIG. 3 is a simplified schematic of a preferred embodiment of the auto-tuned discriminator of FIG. 1;

DETAILED DESCRIPTION OF THE DRAWINGS

It is well known in the art that frequency discrimination of an input signal can be achieved by multiplying the input signal by a time-delayed version of the input signal and filtering the resulting product signal. The time delay corresponds to a phase shift of the input signal which is dependent on input frequency. The multiplication results in a product signal having a dc component which varies approximately linearly with the phase shift. Undesired high frequency components, the largest occurring at twice the input frequency, are removed from the discriminator by filtering. The multiplier is normally operated in a switching mode to make the output independent of input amplitude variations.

Figure 1:
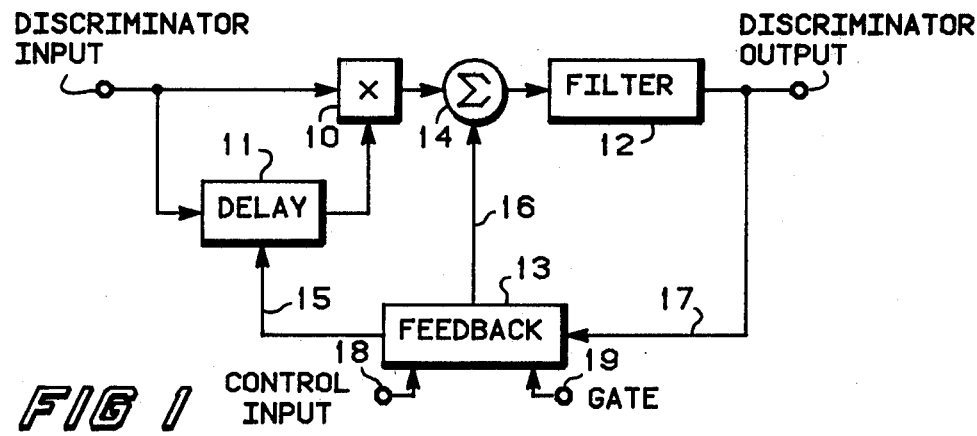
FIG. 1 illustrates in block diagram form an embodiment of the auto-tuned frequency discriminator of the present invention.

As shown in FIG. 1, the discriminator input is coupled to a first input of a multiplier 10 and to an input of delay means 11. The output of delay means 11 is coupled to a second input of multiplier 10. Delay means 11 provides a phase-shifted version of the discriminator input to multiplier 10, the phase shift being dependent on the frequency of the discriminator input signal. The means for delay can be provided by a simple resonant circuit, an active filter, a surface acoustic wave delay line, or any other appropriate method for delaying the input signal. Delay means 11 must have adequate bandwidth and linearity of the phase-frequency response to meet specific requirements of the system implementing the discriminator. The output of multiplier 10 is coupled to a first input of summing circuit 14 which is used to sum a dc bias to the multliplier output. The dc bias can be used to compensate dc offset errors in the multiplier output as explained in more detail below. The output of summing circuit 14 is coupled to the input of filter 12. The output of filter 12 is coupled to the discriminator output and to a first input 17 of feedback circuit 13. Filter 12 removes undesired frequency components, resulting from the multiplication. Therefore, the discriminator output is a dc level dependent on the discriminator input frequency. A first output of feedback circuit 13 is coupled to delay means 11 by line 15. A gate input 19 to feedback circuit 13 is provided to disable and enable the input to feedback circuit 13.

Feedback circuit 13 provides a method for adjusting the delay means transfer function to provide either a known discriminator output or a zero output for a specified input reference frequency. To achieve this, an input signal at the reference frequency is applied to the discriminator input for a period called the clamp period. During this time feedback circuit 13 is enabled by gate input 19, closing the feedback loop, and the control signals on line 15 adjust the delay means transfer function until the discriminator output is equal to the known reference output or zero. When gate signal 19 disables the feedback circuit, an external storage capacitor stores the control signal present at the first feedback input 17. As a result the discriminator is tuned to the reference frequency to provide an output of zero or some other known reference.

Feedback circuit 13 is coupled to a second input of summing circuit 14 via line 16. Summing circuit 14 is used to compensate offset errors which may be introduced by a non-ideal delay means transfer function. A second control signal input 18 to feedback circuit 13 can be used to externally vary the transfer function of delay means 11.

Figure 2:
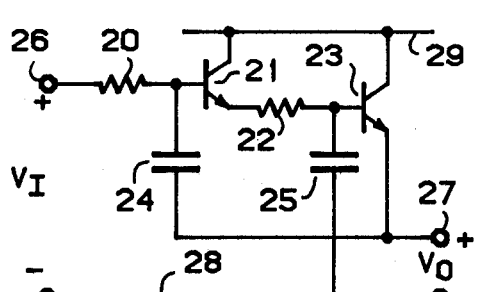
FIG. 2 is a schematic of a filter which can be implemented in the delay means of FIG. 1.

FIG. 2 shows a simplified schematic of the active filter used in the preferred embodiment of delay means 11 shown in FIG. 1. This is a modified version of the well-known Sallen-Key low-pass filter. Input voltage $V_I$ is applied between input node 26 and a voltage bus 28. Input resistor 20 couples input node 26 to the base of transistor 21. The collector of transistor 21 is connected to a voltage bus 29 and resistor 22 is coupled between the emitter of transistor 21 and the base of transistor 23. The collector of transistor 23 is connected to voltage bus 29 and the emitter of transistor 23 is connected to output node 27. Capacitor 24 is coupled between the base of transistor 21 and output node 27. Capacitor 25 is coupled between the base of transistor 23 and bus 28. The output voltage $V_O$ is the voltage from node 27 to bus 28. The addition of transistor 21 is a modification of the standard Sallen-Key configuration and provides a filter having a higher quality factor Q than is possible without the modification. In applications which do not require the higher Q transistor 21 may be omitted by providing a direct connection between the points where the base and emitter of transistor 21 are connected in FIG. 2. Assuming ideal transistors, it can be shown that the transfer characteristic of the filter of FIG. 2 is given by:

$$\frac{V_O}{V_I} = \frac{1}{1 + S\tau_2 + S^2\tau_1\tau_2} \quad (1)$$

where $\tau_1 = C_1R_1$, $\tau_2 = C_2R_2$. $C_1$ and $C_2$ are the capacitances of capacitors 24 and 25, respectively, and $R_1$ and $R_2$ are the resistances of resistors 20 and 22, respectively.

The transfer function of Equation (1) has a pair of complex conjugate poles $S_1$ and $S_2$ given by:

$$S_1 = \alpha_p + j\omega_p$$

$$S_2 = \alpha_p - j\omega_p$$

where $$\alpha_p = -1/\tau_1$$

$$\omega_p = \frac{\sqrt{1 - \frac{\tau_2}{4\tau_1}}}{\sqrt{\tau_1\tau_2}} \quad (2)$$

As is well known, the filter of FIG. 2 will provide a phase delay which is a nonlinear function of angular frequency. The maximum output phase change per input frequency change occurs at the natural frequency $\omega_o$ given by:

$$\omega_o = \frac{1}{\sqrt{\tau_1\tau_2}}$$

The phase-frequency curve approaches a linear response around $\omega_o$. Equation (2) shows that $\omega_p$ is approximately equal to $\omega_o$ when $\tau_2/4\tau_1$ is much less than one. Therefore, the discriminator linearity and input frequency range can be essentially optimized about an input reference frequency $\omega_{ref}$ by selecting $\tau_1$ and $\tau_2$ of the delay filter so that $\omega_p$ is equal to $\omega_{ref}$.

FIG. 3 illustrates a more detailed schematic of a preferred embodiment of the discriminator of FIG. 1. Multiplier 30 has a first differential input at nodes 62 and 63, a second differential input at nodes 68 and 69, and a differential output on nodes 66 and 67. The multiplier configuration is well known in the art and consists of an upper quad differential amplifier formed by transistors 33, 34, 35 and 36, and a lower differential pair formed by transistors 37 and 38.

Node 62 is coupled to the base of transistor 33 and the base of transistor 36. Node 63 is coupled to the base of transistor 34 and the base of transistor 35. Load resistor 31 has one end coupled to a voltage bus 98 and the other end coupled to the collectors of transistors 33 and 35. Load resistor 32 has one end connected to bus 98 and the other end coupled to the collectors of transistor 34 and 36. Node 66 is coupled to the collector of transistor 33 and node 67 is coupled to the collector of transistor 36. Node 68 is coupled to the base of transistor 37 which has its collector coupled to the emitters of transistors 33 and 34. Node 69 is coupled to the base of transistor 38 which has its collector coupled to the emitters of transistors 35 and 36. The emitter of transistor 37 is coupled to the emitter of transistor 38 and to a current source 94 which provides bias current for the multiplier.

Delay filter 40 is a modified Sallen-Key filter as described in the discussion of FIG. 2 but implemented in differential form. Input resistor 42 couples node 63 to the base of transistor 41. Transistor 41 has a collector coupled to bus 98 and an emitter coupled to the base of transistor 45 via resistor 44. Capacitor 43 couples the base of transistor 41 to the emitter of transistor 45. The collector of transistor 45 is coupled to bus 98 and the emitter of transistor 45 is coupled to multiplier input node 68.

Similarly, resistor 51 couples node 62 to the base of transistor 52. Transistor 52 has a collector coupled to bus 98 and an emitter coupled to the base of transistor 55 via resistor 53. Capacitor 54 couples the base of transistor 52 to the emitter of transistor 55. The collector of transistor 55 is coupled to bus 98 and the emitter of transistor 55 is coupled to multiplier input node 69.

Capacitance multiplier 61 provides the means for varying the natural frequency $\omega_o$ of the delay filter by varying the effective capacitance between the bases of transistors 45 and 55. Capacitor 47 couples the base of transistor 45 to the base of transistor 46. The collector of transistor 46 is also coupled to the base of transistor 45 and the emitter of transistor 46 is coupled to the emitter of transistor 57 and to control line 85. Capacitor 56 couples the base of transistor 55 to the base of transistor 57. The collector of transistor 57 is also coupled to the base of transistor 55. The base of transistor 46 is coupled to the anode of diode 49 and to a bias voltage node 96 via resistor 48. The base of transistor 57 is coupled to the anode of diode 59 and to a bias voltage node 97 via resistor 58. The cathode of diode 59 couples to the cathode of diode 49 and to control line 108.

It can be shown that the effective capacitance from the base of transistor 45 to bus 99 or from the base of transistor 55 to bus 99, $C_V$, is given by:

$$C_V = C\left(1 + \frac{I_T}{I_D}\right) \quad (3)$$

where C is the capacitance of capacitor 47 or 56, both capacitors being nominally equal; $I_T$ is the bias current flowing in line 85; and $I_D$ is the bias current flowing in line 108.

Multiplier output nodes 66 and 67 are coupled to the differential input of filter 60 and the differential output of filter 60 is coupled to the discriminator differential output at nodes 64 and 65.

When feedback circuit 70 is enabled it senses the differential output voltage at nodes 64 and 65 and generates the control signals required to tune the delay filter. Comparator 71 is enabled by a gating signal applied at node 125 and has an output coupled to one end of storage capacitor 72. The other end of storage capacitor 72 is coupled to a second voltage bus 99.

The comparator output is also coupled to the input of feedback amplifier 92 by being coupled to the base of transistor 73. The emitter of transistor 73 is coupled to the emitter of transistor 75 and to bus 99 via resistor 76. The collector of transistor 75 is coupled to the base of transistor 77 and to bus 98 via resistor 74. The collectors of transistors 77 and 73 are coupled to bus 98. The emitter of transistor 77 is coupled to the base of transistor 75 via resistor 78. The base of transistor 75 is also coupled to the collector of transistor 79, and the emitter of transistor 79 is coupled via resistor 80 to bus 99. The base of transistor 79 is coupled to a bias voltage node 90.

A first current source 93 provides bias currents $I_D$ and $I_T$ to the capacitance multiplier. Transistor 83 has a collector coupled to line 108 and a base coupled to the emitter of transistor 77. Transistor 84 has a collector coupled to line 85. The emitter of transistor 84 is coupled via resistor 86 to the emitter of transistor 83 and via resistor 87 to bus 99.

A second current source 94 provides bias current $I_M$ to multiplier circuit 30. Transistors 88 and 95 have collectors coupled together and also coupled to the emitters of transistors 37 and 38 of multiplier 30. $I_M$ is the current flowing in the collectors of transistors 88 and 95. The base of transistor 95 is coupled to bias voltage node 90. The emitter of transistor 88 is coupled via resistor 89 to bus 99 and the emitter of transistor 95 is coupled via resistor 91 to bus 99.

Summing circuit 14 of FIG. 1 is formed by the load resistors of multiplier 30 in FIG. 3. The dc offset is summed to the differential output of multiplier 30 by generating an offset current imbalance $I_{OS}$ in resistor 31. $I_{OS}$ is provided by transistor 81 in feedback circuit 70. Transistor 81 has a collector coupled to multiplier output node 66 and an emitter coupled to bus 99 via resistor 82.

Feedback control input 109 is coupled to each of the bases of transistors 75, 81, 84, and 88.

During the operation of the circuit of FIG. 3, the input signal at nodes 62 and 63 is replaced by a signal at the reference frequency for a period called the clamp period. Comparator 71 is enabled by the gating signal at node 125 and the comparator output signal is applied to feedback amplifier 92 which provides the necessary input signals to current sources 93 and 94 to in turn adjust bias currents of multiplier 30 and capacitance multiplier 61. Delay filter 40 is eventually tuned to a condition in which the discriminator differential output signal at nodes 64 and 65 is substantially equal to zero. At the end of the clamp period, tuning has been achieved and the gating signal at node 125 disables comparator 71. Capacitor 72 stores the voltage level at the input of feedback amplifier 92 which was established during the clamp period and thereby keeps the discriminator tuned to the reference frequency of the clamp period.

Some electronic systems require the discriminator to demodulate FM signals at several different carrier frequencies. The discriminator of FIG. 3 can be tuned to different carrier frequencies by the application of an appropriate offset signal at control input 109. Since the various carrier frequencies are all offset by a known amount from the clamp period reference frequency, the necessary offset required at node 109 to tune the discriminator to the carrier frequencies can be determined. For example, the operation of the discriminator of FIG. 3 in a SECAM color demodulator of a multistandard decoder is as follows. The discriminator must be tunable to the SECAM color carrier frequencies of 4.25 MHz and 4.406 MHz with a precision of ±2 KHz and have a transfer characteristic of ±5% tolerance. Delay filter 40 must have a relatively large bandwidth, say 2 MHz, since the frequency deviation about the color carrier is up to 506 KHz.

The reference frequency source in a multistandard decoder will normally be the 4.433 MHz crystal oscillator of the PAL decoder. The discriminator is tuned to this reference during frame flyback when no picture information is transmitted. The discriminator can then be offset to the reference frequencies of 4.25 MHz and 4.406 MHz in response to input signals at node 109. Capacitor 72 must store the tuning voltage during the picture scan time with an allowable discharge of only a few millivolts. Capacitor 72 will be too large for integration in this application, as in many other applications, since a typical value will be ten microfarads.

Component values and operating conditions can be determined for the circuit of FIG. 3 as is now explained. For optimum linearity the discriminator must be tuned so $\omega_p$ equals the reference frequency $\omega_{ref}$ as described earlier. At this frequency, however, the filter provides a phase shift of less than 90 degrees and the discriminator output will not be zero.

The tuning is performed by varying $\tau_2$ of the filter. Using Equation (3) $\tau_2$ is given by:

$$\tau_2 = CR \frac{I_O}{I_D} \quad (4)$$

where R is the resistance of resistor 44 and 53, both resistors being normally equal; C is the capacitance of capacitor 47 or 56, both capacitors being nominally equal; and $I_O$ is the current in resistor 87 which equals the sum of $I_T$ and $I_D$ if ideal transistors are assumed.

In the preferred embodiment, $\tau_1$ of the Sallen-Key filter is fixed and given by:

$$\tau_1 = C_1 R_1 \quad (5)$$

where $C_1$ is the capacitance of capacitor 43 or 54, both capacitors being nominally equal, and $R_1$ is the resistance of resistor 42 or 51, both resistors being nominally equal.

With the active filter tuned to the desired center frequency the phase angle of the output, $\phi$, is given by:

$$\phi = \frac{\pi}{2} - \tan^{-1} \frac{1}{2\sqrt{4\frac{\tau_1}{\tau_2} - 1}} \quad (6)$$

or $$\phi = \pi/2 - \Delta\phi$$

When $\tau_2$ is much smaller than $\tau_1$, $\Delta\phi$ may be approximated by:

$$\Delta\phi = \frac{1}{2\sqrt{4\frac{\tau_1}{\tau_2} - 1}} \quad (7)$$

To achieve the desired zero discriminator output for an input at the reference frequency the phase error $\Delta\phi$ must be compensated out of Equation (6). Substituting for $\tau_1$ and $\tau_2$ from Equation (5) and Equation (4) into Equation (7) we obtain:

$$\Delta\phi = \frac{1}{2\sqrt{4\frac{C_1 R_1}{CR}\frac{I_D}{I_O} - 1}} \quad (8)$$

It can be shown that the discriminator output may be set to zero at the desired reference frequency by adding an offset voltage $V_{OS}$ given by the equation:

$$V_{OS} = \frac{R_L I_M}{\pi} \Delta\phi \quad (9)$$

where $R_L$ is the resistance of load resistor 31, $I_M$ is the bias current supplied to multiplier 30 by current source 94, and $\Delta\phi$ is given by Equation (8). The offset voltage $V_{OS}$ is summed to the output of multiplier 30 in FIG. 3 by developing a current imbalance $I_{OS}$ in resistor 31. From Equation (9) the current $I_{OS}$ supplied by transistor 81 to develop $V_{OS}$ is given by $I_M \Delta\phi/\pi$.

One knowledgeable in the art of integrated circuit fabrication will realize that component tolerance problems are associated with integrated resistors and capacitors due to process variations and temperature effects. For proper operation the transfer characteristic of the discriminator must be independent of tolerances in the absolute values of the active filter tuning components. It can be shown that the phase delay of the active filter is given by $2\tau_1$ when the imaginary part of the pole locations $\omega_p$ is equal to the reference frequency $\omega_{ref}$. Since $\tau_1$ is defined by the values of an integrated capacitor and a resistor it follows that the discriminator transfer function will vary with changes in the component values. This variation is compensated in the invention by adapting the multiplier bias current $I_M$ to maintain the product $I_M \tau_1$ essentially constant.

The offset voltage $V_{OS}$ of Equation (9) is derived below for $\omega_p$ equal to $\omega_{ref}$ and assuming the condition that $I_M \tau_1$ is constant. Using Equations (2), (4), and (5) it can be shown that the following relationship applies when the discriminator is tuned to $\omega_{ref}$:

$$\tau_1 = \frac{\sqrt{1 - \frac{CR}{4C_1 R_1}\frac{I_O}{I_D}}}{\omega_{ref}\sqrt{\frac{CR}{C_1 R_1}\frac{I_O}{I_D}}} \quad (10)$$

To maintain the product $I_M \tau_1$ equal to a constant value K it can be shown from Equation (10) that $I_M$ will be given by:

$$I_M = \frac{2\omega_{ref} K}{\sqrt{4\frac{C_1 R_1}{CR}\frac{I_D}{I_O} - 1}} \quad (11)$$

Equations (8), (9) and (11) can be combined to give:

$$V_{OS} = \frac{\omega_{ref} K R_L}{\left(2\frac{C_1 R_1}{CR}\frac{I_D}{I_O}\right) - 1} \quad (12)$$

Assuming the parenthetical term in the denominator of Equation (12) is much greater than one, it follows that:

$$V_{OS} \approx \frac{I_O}{I_D} \frac{CR \omega_{ref} K R_L}{2C_1 R_1} \quad (13)$$

In FIG. 3 the offset current $I_{OS}$ is supplied by transistor 81 and resistor 82 selected to satisfy Equation (13). The ratio of $I_{OS}$ to $I_O$, the current in resistor 87, is approximately equal to the constant ratio of resistor 87 to resistor 82 since the voltage at the base of transistor 84 equals the voltage at the base of transistor 81. This result follows if the voltage drop across resistors 81 and 82 is substantially larger than the well known quantity KT/q (26 mV at room temperature).

Equation (11) defining the desired multiplier bias current $I_M$ can't be precisely implemented by simple means since the square root of current $I_O$ is involved. However, a good approximation can be achieved by adding a constant current and a current proportional to $I_O$. In FIG. 3 the constant current is provided by transistor 95 and resistor 91 and the proportional current is provided by transistor 88 and resistor 89. In a circuit adapted to operate with ±20% component tolerances, the two current components of $I_M$ need to be approximately equal when the filter tuning components have their nominal values.

The discriminator operation in a system such as a SECAM television system requires that the discriminator be tunable to several reference frequencies. As described before, these frequencies are offset from the clamp period reference frequency $\omega_{ref}$ and the discriminator can be tuned to these frequencies by varying $\tau_2$ which results in a change in $\omega_p$. This is achieved in a manner such that the filter delay remains constant and the discriminator transfer characteristic is unaffected. The imaginary part of the delay filter pole locations, $\omega_p$, is tuned to the offset reference frequencies by varying the current $I_D$ as indicated in the analysis below.

Differentiating Equation (2) with respect to $\tau_2$ and recalling that the imaginary part of the delay filter pole locations, $\omega_p$, is set to the reference frequency $\omega_{ref}$ during the clamp period, results in:

$$\tau_2 \frac{d\omega_p}{d\tau_2} = \frac{-\omega_{ref}}{2} \cdot \frac{1}{1 - \frac{\tau_2}{4\tau_1}} \quad (14)$$

Therefore, if $4\tau_1$ is much greater than $\tau_2$ the change in $\omega_p$ is approximately proportional to the percentage change in $\tau_2$. Some systems may require tuning accuracies which will not allow the use of this approximation. An example is the SECAM television color decoder which requires tuning to several reference frequencies within 1% precision. For such a system, Equation (14) must be implemented as is. Substituting Equations (4) and (5) into Equation (14) and rewriting to represent the differential change in $I_O$ or $I_D$ in terms of the differential change in $\omega_p$ results in:

$$\frac{dI_D}{d\omega_p} = \frac{2}{\omega_{ref}} \left( I_D - \frac{I_O CR}{4 C_1 R_1} \right) \quad (15)$$

$$\frac{dI_O}{d\omega_p} = \frac{-2I_O}{\omega_{ref}} \left( 1 - \frac{I_O CR}{4I_D C_1 R_1} \right) \quad (16)$$

Equation (15) will be easier to implement than Equation (16) since it involves no $I_O^2$ term. Therefore, the change required in $I_D$ for a given change in input frequency is a proportion of $I_D$ minus a proportion of $I_O$.

Figure 4:
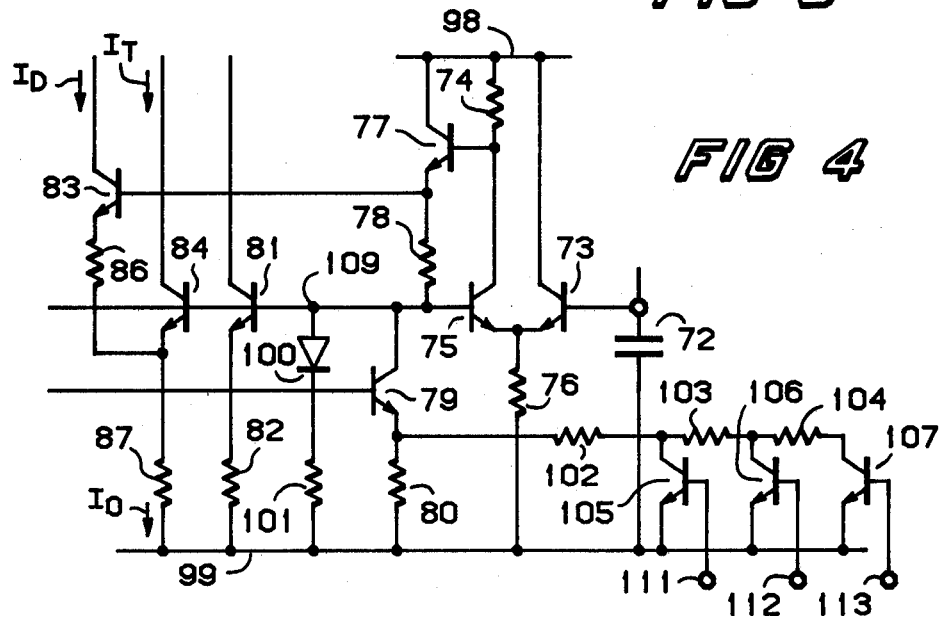
FIG. 4 illustrates in schematic form an embodiment of the feedback circuitry of FIG. 1.

FIG. 4 shows a preferred embodiment for implementing the Equation (15) to offset $\omega_p$ of the discriminator. The elements of FIG. 4 correspond to the elements of FIG. 3 having the same numbers. The anode of diode 100 is coupled to control input 109 and the cathode of diode 100 is coupled via resistor 101 to bus 99. The emitter of transistor 79 is coupled via resistor 102 to the collector of transistor 105 which in turn is coupled via resistor 103 to the collector of transistor 106, which in turn is coupled via resistor 104 to the collector of transistor 107. The emitters of transistors 105, 106, and 107 are coupled to bus 99. The bases of transistors 105, 106, and 107 are coupled respectively to nodes 111, 112, and 113. Transistors 105, 106 and 107 act as switching transistors in response to control inputs at nodes 111, 112, and 113 and vary the effective resistance between bus 99 and the emitter of transistor 79 in response to the control signals.

The current flowing in diode 100 and resistor 101 is proportional to the current $I_O$ in resistor 87. This current is supplied by transistor 77 through resistor 78 due to the feedback action of the circuit. Diode 100 provides a voltage drop essentially equal to the voltage drop across the base-emitter junction of transistor 84. Therefore, a voltage proportional to $I_O$ is developed across resistor 78 causing the current $I_D$ flowing in transistor 83 to increase by an amount proportional to $I_O$. This increase in current will be relatively small, e.g. 5%, to satisfy the conditions derived previously. Therefore, during the clamp period, the circuit of FIG. 4 sets $I_O$ to a value corresponding to a current $I_D$ defined by the current in resistor 86 plus a current proportional to the current in resistor 101, the latter current being proportional to $I_O$.

The above explanation assumes that transistors 105-107 are non-conducting during the clamp period. When one of the control signals at nodes 111-113 switches the associated switching transistor 105-107 on, current $I_D$ increases due to the increased current in transistor 79. The relative increase in $I_D$, however, is less than the relative current increase in the collector of transistor 79 due to the addition of a current component dependent on $I_O$ by an amount which increases with $I_O$. With the appropriate choice of resistor values Equation (15) may be satisfied by the implementation of FIG. 4.

The operation of the circuit of FIG. 4 as described above allows for offsetting the discriminator to a frequency higher than the clamp period reference frequency. It may be desirable to offset the discriminator frequency to a value either lower or higher than the reference frequency. This can be achieved by turning on one of switching transistors 105-107 during the clamp period which allows the effective emitter resistance at the emitter of transistor 79 to be increased or decreased outside of the clamp period by the proper selection of control signals at nodes 111-113.

Figure 5:
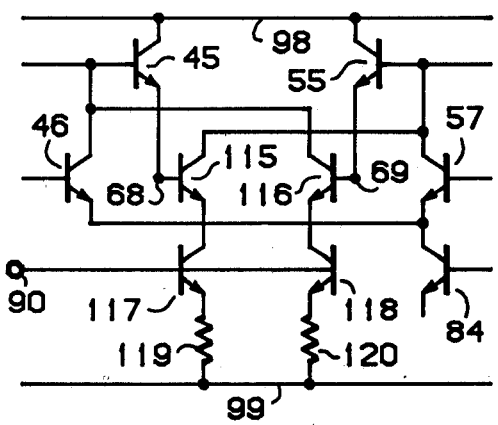
FIG. 5 illustrates in schematic form an embodiment of the circuitry used in the preferred embodiment to cancel isolation capacitances.

One knowledgeable in integrated circuit fabrication techniques will recognize that parasitic capacitances between the collectors of transistors 46 and 57 and bus 99 in FIG. 3, otherwise known as isolation capacitances, can cause degradation in the circuit operation. FIG. 5 shows a schematic implemented in the preferred embodiment for cancelling the effects of these parasitic capacitances. Elements corresponding to the elements of FIG. 3 have the same numbers in FIG. 5. Transistor 115 has a base coupled to node 68 of multiplier 30 and a collector coupled to the collector of transistor 57. Transistor 116 has a base coupled to node 69 of multiplier 30 and a collector coupled to the collector of transistor 46. The emitter of transistor 115 is coupled to the collector of transistor 117 and the emitter of transistor 116 is coupled to the collector of transistor 118. The bases of transistors 117 and 118 are both coupled to bias voltage node 90. The emitter of transistor 117 is coupled to bus 99 via resistor 119 and the emitter of transistor 118 is coupled to bus 99 via resistor 120. Transistors 117 and 118 are dimensioned to have a parasitic isolation capacitance matching the sum of the isolation capacitance of the transistor pair formed by transistors 57 and 115 and the transistor pair formed by transistors 46 and 116. The signal at the collector of transistor 46 and the signal at node 68 will be nearly equal. Similarly, the signal at the collector of transistor 57 and at node 69 will be nearly equal. Due to the differential nature of the active filter, it can be shown that the signals at the bases of transistors 115 and 116 will be equal in amplitude but opposite in phase to the signals appearing at their collectors. Currents induced in the isolation capacitances of transistors 117 and 118 and flowing in transistors 115 and 116 will therefore be equal in amplitude but opposite in phase to the currents flowing in the combined isolation capacitances of transistors 57 and 115, and transistors 46 and 116. As a result, the sum of the currents due to the isolation capacitances at the collectors of transistors 46 and 57 will be essentially zero.

By now, it should be appreciated that there has been provided a new and improved frequency discriminator that can be automatically tuned to compensate for component variations and to receive multiple input carrier frequencies. This invention is easily integrable and is simple enough to be integrated with other circuits on a single integrated circuit. The invention, when used in a SECAM television color decoder, permits integration of the SECAM decoder into a multistandard TV color decoder which includes a PAL color decoder, all on a single integrated circuit.

I claim:

1. An auto-tuned frequency discriminator having an input and an output, the frequency discriminator being fully integrable on a signal integrated circuit and comprising: a multiplier circuit having a first input coupled to the input of the frequency discriminator, a second input, and an output which is proportional to the first input times the second input; a delay means having an input coupled to the input of the frequency discriminator, an output coupled to the second input of the multiplier circuit, and at least one control input, the delay means providing an output signal which is a delayed version of the delay means input signal, the amount of delay being variable in response to the at least one control input; a filter having an input coupled to the output of the multiplier circuit and an output coupled to the output of the frequency discriminator such that high frequency components are filtered from the output of the frequency discriminator; a feedback means having an input coupled to the output of the filter and at least one output coupled to the at least one control input of the delay means so that the variable delay is responsive to the output of the filter; and a summing means having a first input coupled to the output of the multiplier, a second input, and an output coupled to the input of the filter, thereby coupling the output of the multiplier to the input of the filter; and the feedback means further including a second output coupled to the second input of the summing means.

2. The frequency discriminator of claim 1, wherein the feedback means further includes a gate input so that the feedback means can be disabled from the output of the filter, and wherein the feedback means further includes a control input to which the at least one output of the feedback means is responsive so that the variable delay is also responsive to the control input.

3. The frequency discriminator of claim 1 wherein the delay means is an active filter having integrated reactive components so that the filter frequency and phase response is controlled by electrically varying the effective reactance of the integrated reactive components.

4. The frequency discriminator of claim 1 wherein the first multiplier input, second multiplier input, and multiplier output are differential; and the filter input and filter output are differential.

5. The frequency discriminator of claim 1 wherein the first multiplier input, second multiplier input, and multiplier output are differential; and the filter input and filter output are differential.

6. The frequency discriminator of claim 5 wherein the differential output of the multiplier comprises a first output terminal and a second output terminal; and the summing means comprises a first load resistor coupled to the first output terminal of the multiplier, and a second load resistor coupled to the second output terminal of the multiplier; the first output terminal of the multiplier being coupled to the second output of the feedback means so that a bias current generated at the second output of the feedback means will create a voltage drop across the first load resistor thereby creating a voltage imbalance across the differential output of the multiplier.

7. The frequency discriminator of claim 1 wherein the feedback means comprises a comparator having a differential input, an output, and a gating input for disabling and enabling the comparator; an amplifier having an input coupled to the comparator output, a first output, and a second output; a first current source having a first and a second output for controlling the delay provided by the delay means, and having a first input coupled to the first output of the amplifier and a second input coupled to the second output of the amplifier; a second current source for controlling current to the multiplier circuit and having an output coupled to the multiplier circuit and an input coupled to the first output of the amplifier, the output being responsive to the input.

8. The frequency discriminator of claim 1 wherein the feedback means comprises a comparator having a differential input, an output, and a gating input for disabling and enabling the comparator; an amplifier having an input coupled to the comparator output, a first output, and a second output; a first current source having a first and a second output for controlling the delay provided by the delay means, and having a first input coupled to the first output of the amplifier and a second input coupled to the second output of the amplifier; a second current source for controlling current to the multiplier circuit and having an output coupled to the multiplier circuit and an input coupled to the first output of the amplifier, the output being responsive to the input; and an offset current source for generating an offset current and having an output coupled to the summing means by being coupled to the second output of the feedback means and having an input coupled to the second output of the amplifier.

9. The frequency discriminator of claim 8 further comprising a first voltage bus, a second voltage bus, and a bias node; and wherein the amplifier of the feedback means comprises a first transistor, having a base coupled to the input of the amplifier, a collector coupled to the first voltage bus, and an emitter, a second transistor having a base, an emitter coupled to the emitter of the first transistor, and a collector, a first resistor coupled between the emitter of the first transistor and the second voltage bus, a second resistor coupled between the second transistor collector and the first voltage bus, a third transistor having a collector coupled to the first voltage bus, a base coupled to the second transistor collector, and an emitter coupled to the first output of the amplifier, a third resistor coupled between the third transistor emitter and the second transistor base, a fourth transistor having a base coupled to the bias node, a collector coupled to the second transistor base and also to the second output of the amplifier, and an emitter, a fourth resistor coupled between the fourth transistor emitter and the second voltage bus; the offset current source comprises a fifth transistor having a collector coupled to the output of the offset current source, a base coupled to the input of the offset current source, and an emitter, an emitter resistor coupled between the fifth transistor emitter and the second voltage bus; the first current source comprises a sixth transistor having a base coupled to the second input of the first current source, a collector coupled to the second output of the first current source, and an emitter, a seventh transistor having a base coupled to the first input of the first current source, a collector coupled to the first output of the first current source, and an emitter, a fifth resistor coupled between the sixth transistor emitter and the seventh transistor emitter, a sixth resistor coupled between the sixth transistor emitter and the second voltage bus; the second current source comprising an eighth transistor having a base coupled to the input of the second current source, a collector coupled to the output of the second current source, and an emitter, a seventh resistor coupled between the eighth transistor emitter and the second voltage bus, a ninth transistor having a base coupled to the bias node, a collector coupled to the collector of the eighth transistor, and an emitter, an eighth resistor coupled between the emitter of the ninth transistor and the second voltage bus.

10. The frequency discriminator of claim 9 further comprising: a diode means having an anode coupled to the first input of the first current source and a cathode; a resistor coupled between the cathode of the diode means and the second voltage bus; a resistor chain having a plurality of resistors in a series connection, one end of the resistor chain being coupled to the emitter of the fourth transistor; and a plurality of transistors, each transistor, except a last transistor of the plurality, having a collector connected between two consecutive series resistors of the resistor chain, each transistor having an emitter which is coupled to the second voltage bus, and each transistor having a base; the last transistor of the plurality having a collector coupled to another end of the resistor chain, a base, and an emitter coupled to the second voltage bus; and a plurality of switching input terminals, each being coupled to a base of one of the plurality of transistors.

11. The frequency discriminator of claim 1 wherein the at least one control input of the delay means includes a first control input and a second control input, and wherein the delay means is a differential active filter of the Sallen-Key type comprising: a voltage bus; a first transistor having a collector coupled to the voltage bus, a base, and an emitter; a first resistor coupling the base of the first transistor to a first differential input of the delay means; a second transistor having a collector coupled to the voltage bus, an emitter coupled to a first differential output of the delay means, and a base; a first capacitor coupled between the base of the first transistor and the emitter of the second transistor; a second resistor coupling the emitter of the first transistor to the base of the second transistor; a third transistor having a collector coupled to the voltage bus, a base, and an emitter; a third resistor coupling the base of the first transistor to a second differential input of the delay means; a fourth transistor having a collector coupled to the voltage bus, an emitter coupled to the second differential output of the delay means, and a base; a second capacitor coupled between the base of the third transistor and the emitter of the fourth transistor; a fourth resistor coupling the emitter of the third transistor to the base of the fourth transistor; and a capacitance multiplier including: a fifth transistor having a collector coupled to the base of the second transistor, a base, and an emitter; a third capacitor coupling the base of the fifth transistor to the base of the second transistor; a sixth transistor having an emitter coupled to the emitter of the fifth transistor and also to the second control input of the delay means, a collector coupled to the base of the fourth transistor, and a base; a fourth capacitor coupled between the base of the sixth transistor and the base of the fourth transistor; a first diode means having an anode coupled to the base of the fifth transistor and a cathode; and a second diode means having an anode coupled to the base of the sixth transistor and a cathode coupled to the cathode of the first diode means and also to the first control input of the delay means.

12. A method of automatically tuning a frequency discriminator which comprises: applying an input signal to an input of the discriminator, the input signal having a reference frequency; delaying the input signal for a period of time to provide a delayed version thereof; multiplying the input signal by the delayed version to provide a multiplier output signal; compensating offset errors in the multiplier output signal and providing a compensated output signal; filtering the compensated output signal to provide a first output; generating at least one control signal in response to the first output; and varying the period of time in response to the at least one control signal to tune the discriminator.

* * * * *